(12) United States Patent
Leblon et al.

(10) Patent No.: US 10,177,299 B2
(45) Date of Patent: Jan. 8, 2019

(54) METHOD FOR CONTROLLING AT LEAST ONE PIEZOELECTRIC ACTUATOR OF A FUEL INJECTOR OF AN INTERNAL COMBUSTION ENGINE

(71) Applicants: CONTINENTAL AUTOMOTIVE FRANCE, Toulouse (FR); CONTINENTAL AUTOMOTIVE GMBH, Hannover (DE)

(72) Inventors: Michael Leblon, Bressols (FR); Alain Atanasyan, Brax (FR); Jeremie Memain, Lagrace Dieu (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 424 days.

(21) Appl. No.: 14/403,446

(22) PCT Filed: May 21, 2013

(86) PCT No.: PCT/EP2013/001492
§ 371 (c)(1),
(2) Date: Nov. 24, 2014

(87) PCT Pub. No.: WO2013/174504
PCT Pub. Date: Nov. 28, 2013

(65) Prior Publication Data
US 2015/0096539 A1    Apr. 9, 2015

(30) Foreign Application Priority Data

May 23, 2012    (FR) ..................................... 12 54719

(51) Int. Cl.
*H01L 41/04*    (2006.01)
*F02D 41/20*    (2006.01)
(Continued)

(52) U.S. Cl.
CPC ........ *H01L 41/042* (2013.01); *F02D 41/2096* (2013.01); *F02D 41/402* (2013.01);
(Continued)

(58) Field of Classification Search
CPC . H01L 41/042; F02D 41/2096; F02D 41/402; F02D 2041/2051; F02D 2041/2037; Y02T 10/44; F02M 51/0603
See application file for complete search history.

(56) References Cited

U.S. PATENT DOCUMENTS 4,705,003 A    11/1987    Sakakibara et al.
8,154,840 B2 *  4/2012    Hardy ................. F02D 41/2096
                                                361/139

(Continued)

FOREIGN PATENT DOCUMENTS

CN        102102609 A     6/2011
DE   10 2004 018211 A1   11/2005
(Continued)

OTHER PUBLICATIONS

International Search Report, dated Sep. 2, 2013, from corresponding PCT application.

*Primary Examiner* — David Hamaoui
(74) *Attorney, Agent, or Firm* — Young & Thompson (57)    ABSTRACT

A method for controlling a piezoelectric actuator of a fuel injector of an internal combustion engine of a vehicle, the actuator acting on valve elements to open or close the injector, respectively enabling or stopping the injection of fuel into a combustion chamber of the engine, includes the steps of:
  applying to the actuator a first nominal electric charge required to open the injector in accordance with the torque requested and the engine speed, to open the valve elements for fuel injection,
(Continued)

instructing the closure of the injector to stop the fuel injection, by applying an electric discharge to the actuator to close the valve elements, the method applied from an on-board engine control unit during operation, and including applying to the actuator between these 2 steps at least one second electric charge to polarize the actuator during an opening phase of the injector and during fuel injection.

14 Claims, 3 Drawing Sheets

(51) Int. Cl.
  *F02D 41/40* (2006.01)
  *F02M 51/06* (2006.01)
(52) U.S. Cl.
  CPC ............... *F02D 2041/2037* (2013.01); *F02D 2041/2051* (2013.01); *F02M 51/0603* (2013.01); *Y02T 10/44* (2013.01)

(56) References Cited

U.S. PATENT DOCUMENTS

| | | | |
|---|---|---|---|
| 9,502,633 B2* | 11/2016 | Leblon | F02D 41/2096 |
| 9,745,930 B2* | 8/2017 | Leblon | F02M 51/0603 |
| 9,828,956 B2* | 11/2017 | Leblon | F02D 41/2096 |
| 2006/0012265 A1* | 1/2006 | Bachmaier | F02D 41/2096 310/316.01 |
| 2007/0240685 A1 | 10/2007 | Beilharz et al. | |
| 2008/0265715 A1 | 10/2008 | Dollgast et al. | |
| 2010/0288238 A1* | 11/2010 | Beilharz | F02D 41/2096 123/480 |
| 2015/0026940 A1* | 1/2015 | Leblon | F02M 51/0603 29/25.35 |
| 2015/0369187 A1* | 12/2015 | Leblon | F02D 41/2096 239/5 |

FOREIGN PATENT DOCUMENTS

| | | |
|---|---|---|
| DE | 10 2004 021 955 A1 | 12/2005 |
| DE | 10 2004 046 080 A1 | 4/2006 |
| DE | 10 2007 033 469 A1 | 1/2009 |
| DE | 10 2007 047 657 B3 | 4/2009 |
| DE | 10 2007 059 111 A1 | 6/2009 |
| DE | 10 2010 021448 A1 | 12/2011 |
| DE | 10 2011 078844 A1 | 1/2013 |
| EP | 1 138 910 A1 | 10/2001 |
| EP | 1 445 459 A1 | 8/2004 |
| GB | 2 451 754 A | 2/2009 |
| JP | S62-058884 A | 3/1987 |
| JP | S62-58882 U | 4/1987 |
| JP | S63-68746 A | 3/1988 |
| JP | 2008053285 A * | 3/2008 |
| WO | 2004/001794 A2 | 12/2003 |
| WO | 2004/040112 A1 | 5/2004 |
| WO | 2005/061876 A1 | 7/2005 |
| WO | 2005/081332 A1 | 9/2005 |
| WO | 2010/097330 A1 | 9/2010 |

* cited by examiner (Prior Art)

METHOD FOR CONTROLLING AT LEAST ONE PIEZOELECTRIC ACTUATOR OF A FUEL INJECTOR OF AN INTERNAL COMBUSTION ENGINE

BACKGROUND OF THE INVENTION

Field of the Invention

The present invention relates to a method for controlling at least one piezoelectric actuator of a fuel injector of an internal combustion engine of a vehicle, the at least one piezoelectric actuator acting on a valve means in order to open or close the injector, respectively enabling or stopping the injection of fuel into a combustion chamber of the engine, comprising the following steps:

applying to the piezoelectric actuator a first nominal electric charge which is required to open the injector and which is referred to as a nominal control charge, in accordance with the torque requested and the engine speed, so as to open the valve means of the injector for an injection of fuel into the combustion chamber, instructing the closure of the injector in order to stop the injection of fuel, by the application of an electric discharge to the piezoelectric actuator.

Description of the Related Art

It is known to use a piezoelectric actuator in order to instruct the opening and closure of an injector in an internal combustion engine which operates using a fuel of the petroleum or gas oil type.

A piezoelectric actuator is principally composed in known manner of a stack of ceramic members which define a predetermined length, which has the property of causing this length to be modified under the action of an electric field and conversely producing an electric field under the action of mechanical stress; this stack is arranged in an injector between a stop and a valve means and operates in summary in the following manner: when an electric charge is applied to the piezoelectric actuator using an electrical voltage, the length thereof increases and opens the valve means of the injector which releases fuel under pressure into the combustion chamber. In the rest state, that is to say, in the closure position of the valve means, there is play between the piezoelectric actuator and the valve means in order to ensure the closure of this valve means and to prevent uncontrolled leakages of fuel toward the combustion chamber.

In order to be stable and to have a reproducible behavior, a piezoelectric actuator must be polarized at a reference value, which is carried out ex works during the production of the actuator and before the engine is operated in a vehicle. Such a polarization, which is called an initial polarization, involves applying an electric charge via a predetermined voltage, called a polarization voltage, for a time which is also predetermined, to the terminals of the piezoelectric actuator which results in orientating the crystalline structure thereof in the direction of the electric field imposed on the piezoelectric stack, which corresponds to the direction in which the variation of the dimension of the piezoelectric actuator is desired. After this initial polarization voltage has been suppressed at the terminals of the piezoelectric stack, the stack retains a residual polarization state for its subsequent use.

When used in an internal combustion engine, however, a piezoelectric actuator has a tendency to lose this initial polarization, in particular as a result of a substantially urban use of the vehicle which involves low engine speeds and therefore low nominal electrical voltages for controlling the injectors under low fuel pressure, which are largely below the polarization voltage. This is because the value of the nominal electrical supply or control voltage applied to a piezoelectric actuator in order to open an injector is adjusted in accordance with the torque required and the engine speed. In particular and where applicable, it is adjusted in accordance with the value of the fuel pressure which acts counter to the opening of the valve means of the injector, and more generally the energy required to open the valve means of the injector. This adjustment of the electric charge supplied to the piezoelectric actuator, for example, via the electrical voltage, is thus optimized in particular in accordance with the resistance force applied by the fuel pressure and consequently prevents or is intended to reduce clattering of the injector under the action of the application of a force for opening the valve means which is very much greater than this resistance force. The clattering of an injector is substantially a result of the impact of the piezoelectric actuator when it moves into mechanical abutment during its extension under the action of an instruction for opening the injector.

It should be noted that the injectors, in particular for an internal combustion engine operating with diesel fuel under high pressure, are preferably configured so that the pressure of the fuel is used in such a manner that it is applied, in the closure position of the injector, at the side of the valve means which holds it in a position of abutment on the seat thereof. Furthermore, the electric charge required for instructing the opening of the injectors can be adjusted so as to prevent the noise generated by this opening of the injectors from being audible above the general engine noise, that is to say, that a mapping of the nominal opening voltages of the injectors is established ex works in accordance with the engine speed.

Other conditions of use, such as repeated cycles of increase/decrease of the temperature of the engine, or long periods without use of the piezoelectric actuator, corresponding to periods of extended immobilization of the vehicle, may also bring about over time a modification of the polarization of the piezoelectric actuator.

The depolarization or drift brings about a retraction of the stack of ceramic members of the piezoelectric actuator and a resultant increase of the play between the piezoelectric actuator and the valve means. The increase of this play brings about less precise control of the actuator, or drift, which may result in the loss of one or more injections of low quantities of fuel, for example, injections referred to as pilot injections, the injector no longer having the time to compensate for the play and to open the valve for short periods of opening time, which brings about an excess of engine noise of the rattling type (combustion of main injection with a high pressure gradient owing to the lack of the pilot injection), and pollution, and driving discomfort. For longer periods of time for which the injector is open, the drift of the piezoelectric actuator brings about poor control of the quantity of fuel which is actually injected into the combustion chamber.

Figure 1A:
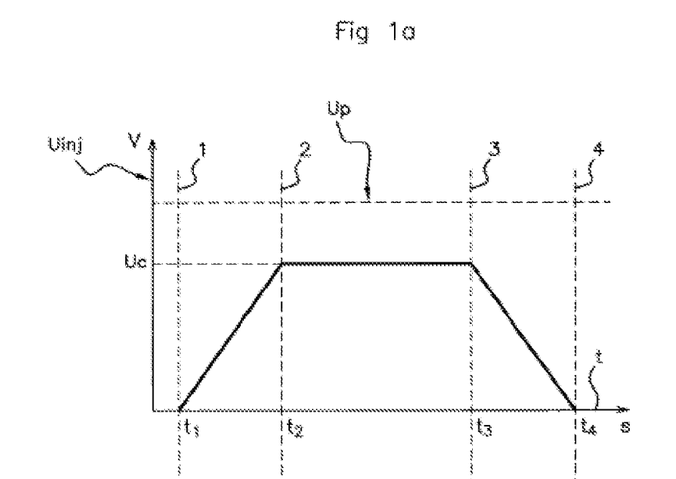
FIGS. 1a and 1b, which have already been discussed above, show two synchronized schematic graphs of an example of a method for controlling an example of a piezoelectric actuator, according to the prior art, relating to, respectively:
- a profile example of the voltage at the terminals of the piezoelectric actuator in accordance with the time for which the injector is opened,
- an example of a charge/discharge current intensity profile passing through the piezoelectric actuator as a function of the time.
Figure 1B:
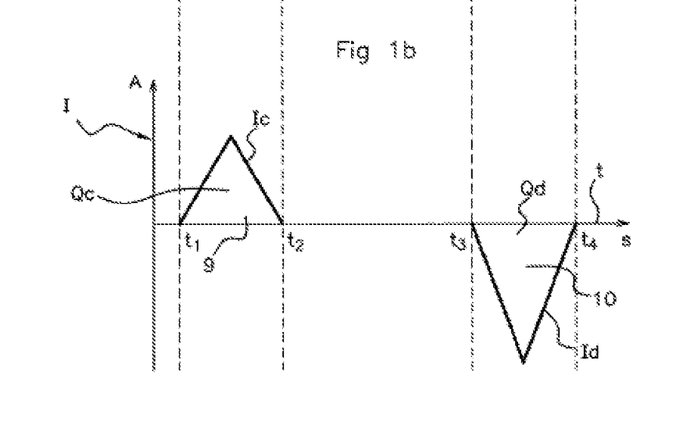

FIGS. 1a and 1b are schematic graphs of an example of control, according to the prior art, of an injector having a piezoelectric actuator, for which: the graph of FIG. 1a is a profile example of the electrical voltage applied to the terminals of the piezoelectric actuator in accordance with the time for which the injector is opened; and the graph of FIG. 1b shows an example of the charge current intensity profile applied to the piezoelectric actuator in accordance with time. The time scale on the two graphs is illustrated in a synchronized manner: for example, the four vertical broken lines 1, 2, 3, 4 indicated across both FIGS. 1a and 1b correspond to four different times $t_1$, $t_2$, $t_3$, $t_4$ on the time scale, respectively, each of these four times $t_1$, $t_2$, $t_3$, $t_4$ being the same for the two graphs.

In FIG. 1a, it can be seen that the electrical voltage Uinj of the charge applied, illustrated on the ordinate axis, comprises a constant and continuous gradient from the time $t_1$ which corresponds to the instruction for opening the injector up to the time $t_2$ which corresponds to a nominal voltage level Uc for controlling the piezoelectric actuator applied for opening the injector, that is to say, for the extension or contraction of the piezoelectric actuator; this nominal voltage level Uc is predetermined by an injection mapping of the engine (not illustrated) and corresponds to the minimum voltage which is required in order to obtain an injector opening action which particularly brings about minimal noise and which is suitable for a required engine torque and an engine speed. The nominal voltage Uc illustrated in FIG. 1a is lower than the polarization voltage Up of the piezoelectric actuator. The voltage Uinj applied to the piezoelectric actuator is then kept constant at the level of the nominal voltage Uc, in general as a result of the fact that, since the piezoelectric element behaves in the manner of a capacitor, it retains the voltage Uc thereof applied to the terminals thereof. This nominal voltage Uc is kept constant until the time $t_3$ which corresponds to the instruction for closing the injector, which is illustrated on the axis of the abscissa t which corresponds to the timescale. Then, from the time $t_3$, the voltage Uinj decreases as far as the time $t_4$ for the closure of the injector, resulting from an electric discharge of the piezoelectric actuator which thus returns to its initial contracted length which corresponds to the closure of the injector. The electric discharge can be obtained, for example, by means of a short-circuiting of the terminals of the piezoelectric actuator.

FIG. 1b illustrates in a schematic manner, on the axis of the ordinate I corresponding to the charge/discharge current passing through the piezoelectric actuator, a first charge current intensity line Ic, between the times $t_1$ and $t_2$, which correspond to the application of the nominal voltage Uc in order to open the injector by increasing the length of the actuator, and a second discharge current intensity line Id for the closure of the injector which corresponds to the drop of the voltage Uinj between the times $t_3$ and $t_4$, resulting from an electric discharge of the piezoelectric actuator, for example, by a short-circuiting of the terminals thereof, in order to obtain a rapid contraction thereof and thus the closure of the injector. The electric charge Qc applied to the piezoelectric actuator for opening the injector may be calculated in known manner from the surface-area 9 in FIG. 1b, defined between the charge current pulse line Ic and the axis t of the abscissa; the same applies to the electric discharge Qd applied to the piezoelectric actuator in order to close the injector, from the surface-area 10 in FIG. 1b, defined between the discharge current pulse line Id and the axis t of the abscissa for the closure of the injector, and which is, for example, substantially equal to −Qc.

The electrical control time of the injector is defined as being the time for maintaining the electric charge which is applied to the piezoelectric actuator. This is precisely the time between the opening instruction and the closure instruction of the injector; it is therefore between $t_3$ and $t_1$ as illustrated in the Figures.

There are methods for compensating for the depolarization of a piezoelectric actuator which are intended to polarize it again after the initial polarization provided ex works and which are more or less efficient and costly and which generally require the disassembly of the injector and/or a workshop operation for the vehicle. Often, the piezoelectric actuator, or the injector, is replaced when the depolarization is excessive, and it is no longer possible to compensate for it in an effective manner.

It is known in particular to precharge a piezoelectric element of an injector by initially polarizing this piezoelectric element by means of the application of a polarization voltage before an injection of fuel, the initial polarization being carried out only when the rotation speed of the motor exceeds a predetermined value in an attempt to open the injector more rapidly.

BRIEF SUMMARY OF THE INVENTION

An object of the invention is to overcome the disadvantages mentioned above and more generally to improve the performance of an injector with piezoelectric control, and proposes an on-board method for controlling an injector with piezoelectric control. More specifically, the invention involves a method for controlling at least one piezoelectric actuator, as defined at the beginning of the description in the technical field to which the invention relates, characterized in that it is applied from an engine control unit on-board the vehicle during operation and in that it further comprises a step which involves applying to the piezoelectric actuator at the nominal control charge, after the application thereof and before the step which involves instructing a closure of the injector, at least one second electric charge, referred to as a polarization charge, in addition to the nominal control charge, so as to polarize the piezoelectric actuator during an opening phase of the injector and during the injection of the fuel into the combustion chamber.

The present invention allows the piezoelectric actuator to be kept in a polarized state from the time it leaves the works, during use of the vehicle, in an automatic manner during the use thereof, without requiring the engine to stop, and thus allows the longevity of the actuators to be increased whilst reducing the maintenance operations. Furthermore, the present invention enables the performance of the injector to be improved, whilst reducing the drift of the play between the piezoelectric actuator and the valve means, and finally allowing better control of the quantity of fuel injected into a combustion chamber. The application of a polarization charge to a piezoelectric actuator during operation on a vehicle is not normally possible because of the noise that such a polarization voltage would generate, affecting the driving comfort of the vehicle. The application according to the invention of at least one electric charge to the actuator on two occasions, firstly for the nominal control of the piezoelectric actuator in accordance with the injection calibration, then secondly for the polarization thereof, allows the polarization operation to be prevented from generating engine noises and in particular clattering of the injectors. The method according to the invention may advantageously be implemented in an engine control unit (ECU) of the vehicle using software for implementing the method, for controlling all of the injectors of the engine. It should be noted that the method according to the invention can be integrated in the ECU processor of existing vehicles using a simple modified item of software for instructing/controlling the piezoelectric actuators of the injectors of the engine.

According to an advantageous feature, the polarization charge which is defined by a corresponding current profile applied to the piezoelectric actuator is decoupled from the nominal control charge, that is to say, separated therefrom over time.

The decoupling of the charges, used here in the sense of a separation of the charges over time, in that the polarization change intervenes temporally after the current of the main charge has become zero, at least for a time, in the order of a few microseconds, allows the nominal control charge of the piezoelectric actuator, which is conventionally applied by the engine control unit together with the engine torque required or the engine speed, not to be modified and allows the excess polarization charge to be made independent of this nominal control charge.

According to an advantageous feature, the first and second electric charges are obtained by the respective application of first and second electrical voltages, referred to as a nominal charge voltage and a polarization voltage, the second electrical voltage being greater than the first.

The application of a polarization voltage, which is a high voltage, in place of a nominal control voltage of the actuator cannot normally be envisaged as a result of the injector noises which this would bring about, at least at engine speeds which exclude the highest speeds. The division of the voltage applied to the actuator provides a solution to this problem, and advantageously allows decoupling of the nominal charge current and polarization current applied to the piezoelectric actuator.

According to an advantageous feature, there is a level called a charge level in the development of the voltage applied to the piezoelectric actuator over time, the charge level being located at the level of the first electrical voltage or nominal charge voltage.

This level of voltage applied to the actuator in accordance with time when the piezoelectric actuator is charged allows action to be taken with a view to reducing the noise of the injector during the second so-called polarization charge. This is because the application of the first electrical voltage with limited energy (in order to reduce where applicable the mechanical impact noise on the stop) will allow the phenomenon of opening the injector to be started and will advantageously open the injector, and the second voltage referred to as the polarization voltage will then be applied. The charge level may be minimized and be almost imperceptible, for example, reduced to a very small fraction of a second, approximately in the order of a microsecond, or may form a more marked level which is greater than or equal to several microseconds, for example, from 10 to 100 µs. The charge level advantageously allows adjustment of the time which separates the nominal charge and the polarization charge applied to the piezoelectric actuator, for example, in accordance with the time available for the application of the polarization charge between the opening charge of the injector and the discharge for the closure thereof.

According to an advantageous feature, the injection of fuel through the injector is carried out several times involving at least one main injection, the polarization voltage being applied during the main injection.

The main injection allows a longer time to be made available for a more efficient polarization during the injection phase.

According to an advantageous feature, the step involving instructing the closure of the injector involves the application of a first electric discharge of the piezoelectric actuator up to the nominal control charge thereof, followed by a second electric discharge of the actuator until the valve means is closed.

According to an advantageous feature, the first and second electric discharges of the piezoelectric actuator are decoupled, that is to say, separated over time.

According to an advantageous feature, the first electric discharge of the piezoelectric actuator up to the nominal control charge is obtained by application of a first electric discharge current which reduces the voltage at the terminals of the piezoelectric actuator as far as the nominal charge voltage, and the second electric discharge of the actuator is obtained by the application of a second electric discharge current.

The division of the electric discharges advantageously allows decoupling of the discharge currents applied to the actuator.

According to an advantageous feature, there is a level, called the discharge level, in the development of the voltage applied to the piezoelectric actuator over time during an electric discharge thereof.

The discharge level may be minimized and be almost imperceptible, for example, reduced to a very small fraction of a second, in the order of approximately one microsecond, or form a more marked level which is greater than or equal to several microseconds, for example, from 10 to 100 µs. The discharge level advantageously allows adjustment of the time which separates the discharges applied to the piezoelectric actuator in order to close the injector, for example, in accordance with the remaining time available before closure of the injector. During the development of the voltage at the terminals of the piezoelectric actuator during its electric discharge, called discharge voltage, the discharge level advantageously allows adjustment of the decoupling of the polarization and nominal discharge currents which are applied to the actuator.

According to a feature, the level in the development of the voltage applied to the piezoelectric actuator over time during an electric discharge thereof is located at a voltage which is lower than the nominal charge voltage, in order to take into account a phenomenon of extension hysteresis of the piezoelectric actuator.

This feature in particular enables an item of software for implementing the method according to the invention to be interfaced with an existing injector control mapping which is already implemented in an engine control unit, without any modification thereof. The implementation of an item of software for implementing the method according to the invention thus does not substantially modify the quantity of fuel leaving an injector for a given electrical time for instructing the opening of the injector.

According to a feature, the polarization charge is deactivated above a predetermined value threshold for torque or rotation speed of the engine.

The polarization charge is preferably applied in a permanent and continuous manner to all of the engine speeds. However, it may be envisaged to deactivate this polarization charge at a high engine speed or at a high charge since the nominal voltage for instructing a piezoelectric actuator is close to the polarization voltage. The application of a polarization charge becomes more efficient and advantageous as the nominal control charge of the actuator becomes lower.

According to an advantageous feature, the increase of electrical voltage between the nominal charge voltage and the polarization voltage is between 5 and 40 volts, in order to reach a maximum polarization voltage value in the order of 140 volts, for example.

BRIEF DESCRIPTION OF THE DRAWINGS

Other features and advantages will be appreciated from the following description of two examples of an embodiment of a method according to the invention, together with the appended drawings, the examples being given by way of non-limiting illustration.

FIG. 3b shows a schematic graph which is synchronized with FIG. 3a of the intensity profile of the charge/discharge current passing through the piezoelectric actuator as a function of the time corresponding to the third voltage profile example of FIG. 3a.

DETAILED DESCRIPTION OF THE PREFERRED EMBODIMENTS

Figure 2A:
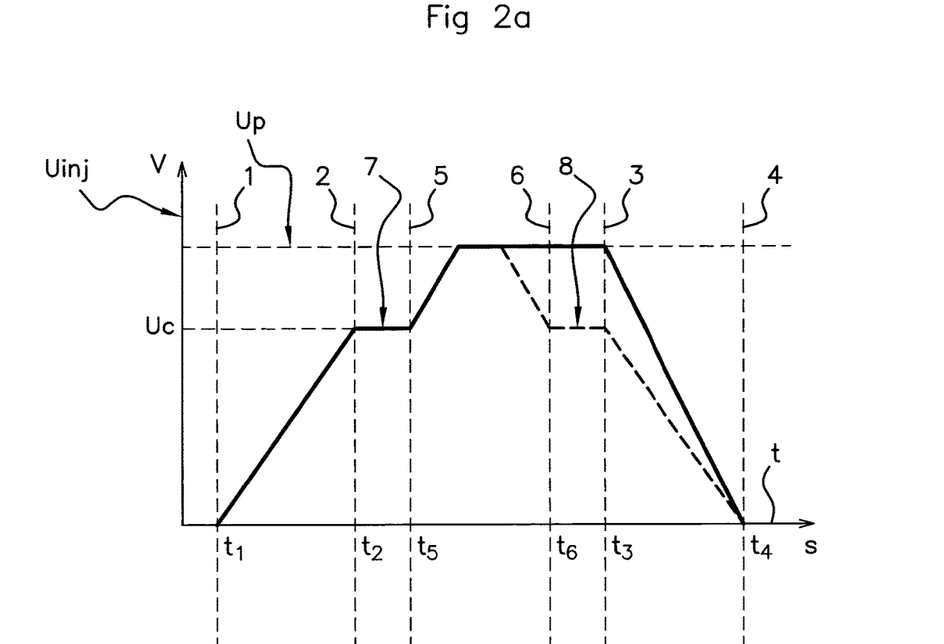
FIG. 2a shows two synchronized schematic graphs of the voltage profile at the terminals of the piezoelectric actuator as a function of the time for which the injector is opened, according to a first example (broken line) and a second (continuous line) example of an embodiment of a control method according to the invention for a piezoelectric actuator.
Figure 2B:
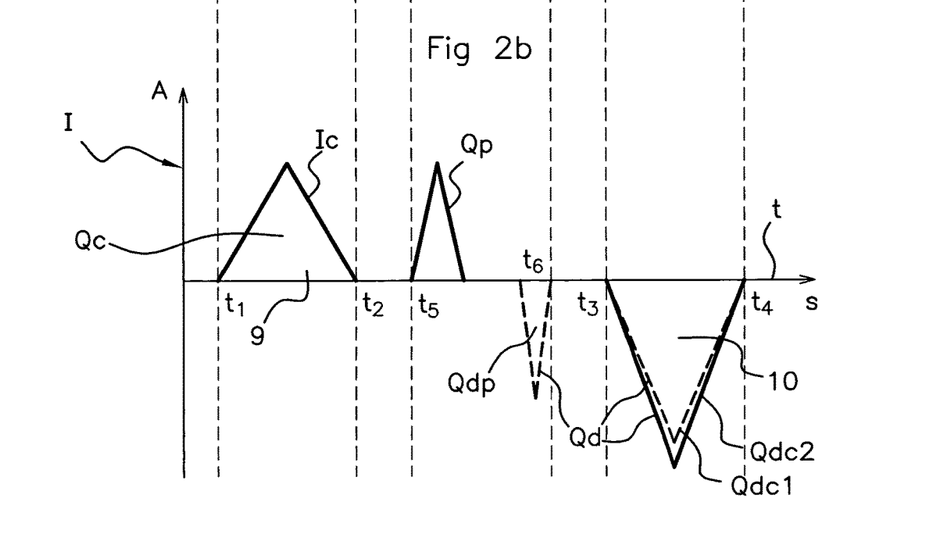
FIG. 2b shows two schematic graphs synchronized with FIG. 2a, of a first (broken line) and a second (continuous line) intensity profile of the charge/discharge current passing though the piezoelectric actuator as a function of time, corresponding to the first and second voltage profile examples of FIG. 2a, respectively.

FIGS. 2a and 2b will now be described in relation to the first embodiment example (broken line).

It should be noted that this first example in FIGS. 2a and 2b uses the same basic schematic graphs as FIGS. 1a and 1b according to the prior art, respectively, to which the first example of a method according to the invention has been applied, as will be described in greater detail below. The corresponding basic profile examples of electrical voltage and current intensity corresponding to the opening and closure of the injector are therefore identical in FIGS. 2a and 2b and in FIGS. 1a and 1b, respectively, setting out the same first basic example for controlling a piezoelectric actuator in order to open and close an injector. These basic signals for instructing a piezoelectric actuator will therefore not be described in greater detail in the context of the description of the first example of an embodiment of the method according to the invention with reference to FIGS. 2a and 2b, the reader being referred back to the description given above of FIGS. 1a and 1b for these basic signals. In FIGS. 2a and 2b, two vertical broken lines 5 and 6 have been added across both FIGS. 2a and 2b and correspond to two different times $t_5$ and $t_6$ on the timescale t, respectively, each of these two times $t_5$ and $t_6$ being the same for the two graphs 2a and 2b, the times $t_5$ and $t_6$ being between the times $t_2$ and $t_3$ as explained in detail below.

Furthermore, the electronic control system of a piezoelectric actuator is also known to the person skilled in the art and will not be described in greater detail here. For the application of the method for controlling the piezoelectric actuator according to the invention, the electronic control system as known may be suitable. The method for controlling the piezoelectric actuator according to the invention can be implemented using control software which will be implemented in the engine control unit of the vehicle.

The first method example schematically illustrated in FIGS. 2a and 2b is an example of a method for controlling at least one piezoelectric actuator for injecting fuel for an internal combustion engine of a vehicle, the at least one piezoelectric actuator acting on a valve means in order to open or close the injector, permitting or stopping the injection of fuel into a combustion chamber of the engine, respectively. It is specified in this instance that the expressions "opening and closure of the valve means of the injector" and "opening and closure of the injector" are considered to have an equivalent meaning. It should be noted that only the signals for controlling voltage and charge current intensity applied to and passing through the piezoelectric actuator have been illustrated in the Figures, the method according to the invention being able to be applied to an internal combustion engine of known type which is provided with injectors also of known type, which have therefore not been illustrated.

The control method according to FIGS. 2a and 2b is applied from an engine control unit ECU (not illustrated) of known type which is on-board the vehicle during operation, for example, using an item of control software which is implemented in the engine control unit, and comprises the following steps involving:
- applying in known manner to the piezoelectric actuator a first nominal electric charge Qc which is required to open the injector, called the nominal control charge Qc, between the times $t_1$ and $t_2$, as a function of the torque requested and the engine speed, for example, according to a predetermined conventional voltage gradient in the engine control unit, in order to open the valve means of the injector for an injection of fuel into the combustion chamber, as illustrated in FIG. 2b,
- applying according to the invention to the piezoelectric actuator on the nominal control charge Qc, from a time $t_5$ which follows $t_2$, after the application thereof and before the step involving instructing a closure of the injector, therefore before the time $t_3$, a second electric charge Qp, called a polarization charge Qp, in addition to the nominal control charge Qc, in order to polarize the piezoelectric actuator during an opening phase of the injector and during the injection of the fuel into the combustion chamber, as illustrated in FIG. 2b,
- then instructing the closure of the injector at the time $t_3$ in order to stop the injection of fuel, by applying an electric discharge Qdc1, Qdc2 to the piezoelectric actuator between the times $t_3$ and $t_4$, for example, as illustrated in FIG. 2b.

As illustrated in FIG. 2b, the polarization charge Qp, defined by a corresponding current profile applied to the piezoelectric actuator, is advantageously decoupled from the nominal control charge Qc, which can be seen in the example in that the end of the control charge Qc and the beginning of the polarization charge Qp are separated by a time $t_5-t_2$ not equal to zero.

As illustrated in FIG. 2a, the first electric charge Qc and second electric charge Qp are, for example, obtained by means of the application of a first electrical voltage Uc and second electrical voltage Up, called nominal charge voltage Uc and polarization voltage Up of the piezoelectric actuator, respectively, the electrical polarization voltage being greater than the electrical nominal charge voltage Uc.

It should be noted that, in the examples of embodiments according to FIG. 2a, there is a level 7 in the development of the charge voltage applied to the piezoelectric actuator over time, this level 7 preferably being located in the region of the first electrical voltage Uc or nominal charge voltage. This voltage level 7 which represents the period of time which elapses between the end of the application of the electric charge Qc for instructing the opening of the actuator and the beginning of the application of the polarization charge, that is, a time which is equal to $t_5-t_2$, may be between 0 (excluded) and a few microseconds, or may form a more marked level in the order of several microseconds, for example, from 10 to 100 µs, in accordance with the conventional time available for applying a polarization charge during the opening of the injector, given by the engine control unit. The minimum time is preferably defined so that the charges Qc and Qp are decoupled, that is to say, they are separated over time.

Furthermore, the voltage gradients applied to the terminals of the piezoelectric actuator, between the times $t_1$ and $t_2$, on the one hand, for instructing the opening of the injector and after the time $t_2$, on the other hand, in order to polarize the actuator, are illustrated in FIG. 2a as having the same value or substantially the same value. However, it should be noted that these gradients may be different from each other.

It should be noted that FIGS. 2a and 2b illustrate, for example, a main fuel injection, given that the method according to the invention may be applied to a cycle which comprises multiple injections which are in particular carried out several times, comprising at least one main injection, for example, at least one pilot injection and at least one main injection, the charge Qp or polarization voltage Up preferably being applied in this instance during the main injection.

The polarization voltage Up at the terminals of the piezoelectric actuator remains constant, in general as a result of the fact that the piezoelectric element, since it behaves as a capacitor, retains the voltage applied to the terminals thereof until the electric discharge of the actuator in order to close the injector or until the electric discharge of the polarization, that is to say, until the time $t_3$ for the first instance (second example) as set out below in detail.

According to the first example of an embodiment illustrated with broken lines in FIGS. 2a and 2b, the step involving instructing the closure of the injector involves the application of a first electric discharge Qdp of the piezoelectric actuator up to the nominal control charge Qc thereof, or substantially this nominal charge Qc, followed by a second electric discharge Qdc1 of the actuator until closure of the valve means, as illustrated in the broken line portion of FIG. 2b.

In this first example, the first discharge Qdp is applied before the time $t_3$, or before the closure of the injector, so that the first electric discharge Qdp and second electric discharge Qdc1 of the piezoelectric actuator are decoupled as illustrated in FIG. 2b. In the example, the decoupling of the discharges Qdp and Qdc1 can be seen by the existence of a time period which is not equal to zero between the time $t_6$ corresponding to the end of the polarization discharge Qdp and the subsequent time $t_3$ which corresponds to the beginning of the control discharge Qdc1 for closure of the injector.

As illustrated in FIG. 2a with broken lines so as to correspond in a synchronized manner to FIG. 2b, the first electric discharge Qdp of the piezoelectric actuator as far as the nominal control charge Qc is advantageously constituted by a first electric discharge current which reduces, for example, the voltage at the terminals of the piezoelectric actuator as far as the nominal charge voltage Uc, the second electric discharge Qdc1 of the actuator being constituted by a second electric discharge current until the piezoelectric actuator returns to the initial length thereof which brings about the closure of the injector. The first and second electric discharge currents can, for example, be obtained by short-circuiting the terminals of the piezoelectric actuator.

It should be noted in FIG. 2a and from the broken line of the first example that there is a level 8 in the development of the voltage applied to the piezoelectric actuator over time during an electric discharge thereof, this level 8 being, for example, located in the region of the nominal charge voltage Uc, as illustrated in FIG. 2a. This voltage level 8 illustrating the period of time which elapses between the time $t_6$ of the end of the application of the electric polarization discharge Qdp of the actuator and the subsequent time $t_3$ at the beginning of the application of the control discharge Qdc1, that is, a time which is equal to $t_6-t_3$, may be between 0 (excluded) and a few microseconds, or may form a more marked level in the order of a few microseconds, for example, from 10 to 100 µs in accordance with the conventional time available for applying the control discharge for closure of the injector, given by the engine control unit which imposes the opening time of the injector. The minimum time is preferably defined so that the electric discharges Qdp and Qdc1 are decoupled, that is to say, they are separated over time.

Furthermore, the gradients of voltage drop applied to the piezoelectric actuator in FIG. 2a (broken lines), for the discharge of the polarization, on the one hand (before time $t_3$), and for the discharge of the actuator in order to close the injector (from time $t_3$), are illustrated in FIG. 2a as having the same value or substantially the same value. However, it should be noted that these gradients may be different from each other. Furthermore, the discharge gradient(s) may be different from the charge gradients.

FIGS. 2a and 2b will now be described in relation to the second embodiment example (continuous line).

It should be noted that this second example shows in FIGS. 2a and 2b a portion common to the first example described above, which involves the control of the opening charge Qc of the injector and the control of the polarization charge Qp, as illustrated. The difference involves a different method for controlling the discharge of the piezoelectric actuator in order to close the injector, after having applied the polarization charge Qp. This difference more specifically involves the absence of a voltage level in the discharge of the actuator, resulting from an electric discharge Qdc2 of the actuator in this second example which is produced in one step from the time $t_3$ to the time $t_4$, as illustrated in FIG. 2b. In FIG. 2a, it can be seen that the discharge voltage drops between the times $t_3$ and $t_4$, in order to reach a value zero at the time $t_4$, corresponding to the closure position of the injector, according to a constant gradient. In this second example, the first discharge Qdp of the first example therefore does not exist, and only the discharge Qdc2 is applied in this instance at the time $t_3$ from the polarization voltage Up and illustrates the closure of the injector in a single instruction from the polarization voltage Up.

The application of this second embodiment is dependent on the time available for opening the injector and where applicable the level of noise permissible for the closure of the injector. This second embodiment where applicable allows a longer period of time to be made available for maintaining the actuator at the polarization voltage Up.

Figure 3A:
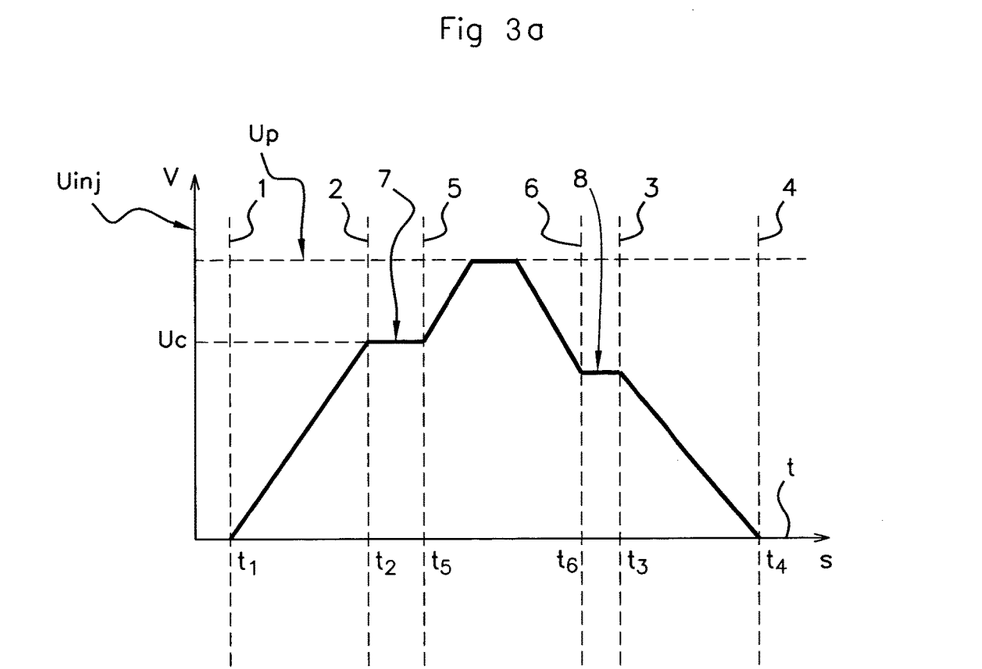
FIG. 3a shows a schematic graph of the voltage profile at the terminals of the piezoelectric actuator as a function of the time for which the injector is open, according to a third example of an embodiment of a method for controlling a piezoelectric actuator according to the invention.
Figure 3B:
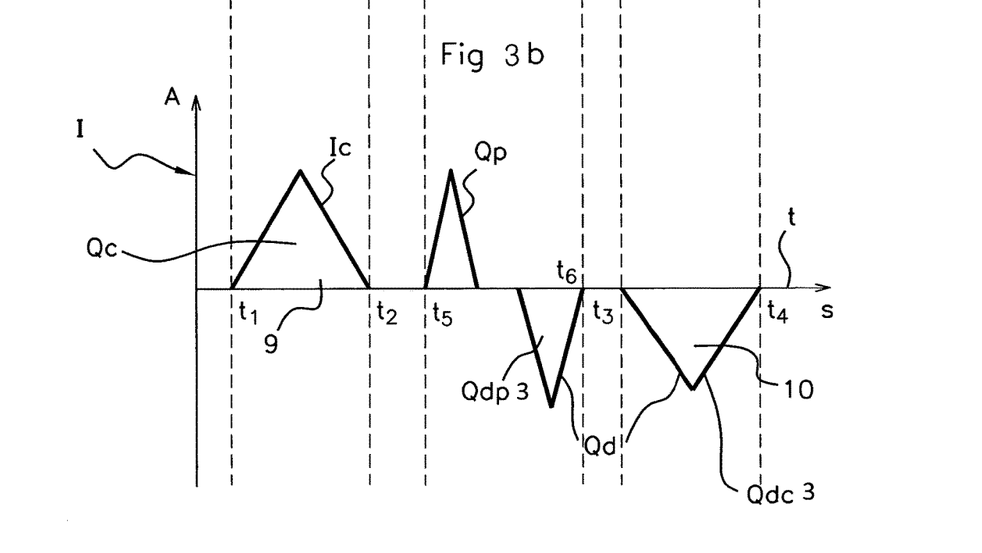

FIGS. 3a and 3b will now be described in relation to the third preferred example of an embodiment of a method for controlling a piezoelectric actuator according to the invention.

It should be noted that this third example shows in FIGS. 3a and 3b a portion which is common to the first example described above with reference to FIGS. 2a and 2b, which involves control of the opening charge Qc of the injector and control of the polarization charge Qp, as illustrated.

This third example is also similar to the first example in FIGS. 2a and 2b with regard to the discharge of the piezoelectric actuator in that this discharge also comprises in this third example a level 8 in the development of the discharge voltage, as illustrated.

In FIGS. 3a and 3b, the reference numerals used are identical to those of FIGS. 2a and 2b, first example, for means, elements or events which are similar.

The difference from the first example illustrated in FIGS. 2a and 2b involves a different method for controlling the discharge of the piezoelectric actuator in order to close the injector, after having applied the polarization charge Qp. This difference involves more specifically a discharge level 8 which is not located in the region of the control charge voltage Uc The discharge voltage level 8 according to this third example is advantageously located at a voltage level which is lower than the level of the control charge voltage Uc in order to take into account a hysteresis phenomenon of the piezoelectric actuator.

This is because, according to the first example, an iso-voltage discharge level 8 is carried out at the terminals of the piezoelectric actuator, with the charge level 7; that is to say, the length of the piezoelectric actuator at the discharge level is not the same as that corresponding to the charge level 7, taking into account the extension hysteresis of the piezoelectric actuator, which is dependent on the actuator itself. This length at the discharge level is greater.

The preferred third example in FIGS. 3a and 3b carries out a discharge level 8 with iso-displacement of the piezoelectric actuator with the charge level 7 corresponding to the control charge Qc for opening the injector. This means that the voltage level of the discharge level 8 according to this third example is less than the iso-voltage discharge voltage level of the first example, by a value given by the actual hysteresis line of the piezoelectric actuator used. This characteristic of a discharge level 8 with iso-displacement with the charge level 7 allows the time to be improved for the piezoelectric actuator to return to its original size which it had before the control charge Qc was applied and therefore allows the control of the closure of the injector to be improved, in particular when the method according to the invention is interfaced with an existing control mapping of the injector. In this manner, this characteristic of a discharge level 8 with iso-displacement allows the original mapping of the injector implemented in the engine control unit not to be modified and enables the method according to the invention to be implemented using an additional item of software which will be implemented in the engine control unit without modification of this mapping which already exists.

In practice, the instruction of the discharge of the piezoelectric actuator from the polarization voltage Up will advantageously be carried out by means of learning of the hysteresis line as follows:
a first discharge Qdp3 of the actuator will be instructed, from the knowledge of the hysteresis line thereof so that the piezoelectric actuator returns to a length which is equal or substantially equal to the length which corresponds to the control charge Qc,
a second discharge Qdc3 will then be instructed so that the piezoelectric actuator returns to the initial length before the control charge Qc was applied, this second discharge advantageously corresponding to the normal or nominal electric discharge of the piezoelectric actuator for the electrical time applied to the actuator.

With the exception of the voltage level of the discharge level 8, what has been set out above relating to the discharge level 8 in relation to the first example applies to the discharge level 8 of this third example.

In FIG. 3b, the distribution of the electric discharges Qd can be seen, more specifically the polarization discharge Qdp3 and control discharge Qdc3 which are applied to the piezoelectric actuator. In the example illustrated, the polarization discharge Qdp3 is greater than the polarization discharge Qdp of the first example (FIG. 2b) and the control discharge Qdc3 is lower than the control discharge Qdc1 of the first example (FIG. 2b). This control discharge Qdc3 advantageously corresponds to the discharge programmed in the initial control mapping of the injector in accordance with the electrical control time of the injector.

Preferably, the polarization charge is applied in a permanent and continuous manner during the operation of the engine in the vehicle in order to ensure a unique polarization voltage over the range of torque/rotation speed values of the engine. Alternatively, the polarization charge can be deactivated above a predetermined threshold for a value of torque or rotation speed of the engine corresponding to control voltage values of the piezoelectric actuators close to the polarization voltage.

By way of example, the increase of electrical voltage between the nominal charge voltage Uc and the polarization voltage Up may be between 0 (exclusive) and 40 volts, in order to reach a maximum polarization voltage value Up in the order of 140 volts, for example, the range used of control voltages Uc for the piezoelectric actuator in accordance with the engine speed and the engine torque required substantially being between 100 and 140 volts in the example.

The polarization charge as described with reference to FIGS. 2a and 2b, 3a and 3b, is, for example, advantageously applied in a continuous manner to all the injectors of the engine of the vehicle, each time an injector is opened for a main injection of fuel.

The invention claimed is:

1. A method for controlling at least one piezoelectric actuator of a fuel injector of an internal combustion engine of a vehicle, the at least one piezoelectric actuator acting on a valve in order to open or close the injector, respectively enabling or stopping the injection of fuel into a combustion chamber of the engine, comprising:
applying to the piezoelectric actuator a first nominal electric charge that is a nominal control charge which is required to open the injector, in accordance with the torque requested and the engine speed, for a given electrical control time to open the valve of the injector for an injection of a quantity of fuel into the combustion chamber corresponding to the electrical control time;
instructing the closure of the injector in order to stop the injection of the quantity of fuel, by an application of an electric discharge to the piezoelectric actuator in order to close the valve; and
applying to the piezoelectric actuator at the nominal control charge, after the application thereof and before the instructing the closure of the injector, at least one second electric charge that is a polarization charge, in addition to the nominal control charge, to polarize the piezoelectric actuator during an opening phase of the injector and during the injection of the fuel into the combustion chamber while not substantially modifying the quantity of fuel injected for the given electrical control time, wherein the control method is applied from an engine control unit on-board the vehicle during operation.

2. The method as claimed in claim 1, wherein the polarization charge which is defined by a corresponding current profile applied to the piezoelectric actuator is separated from the nominal control charge over time.

3. The method as claimed in claim 1, wherein the first electric charge and second electric charge are obtained by the respective application of first and second electrical voltages that are a nominal charge voltage and a polarization voltage, respectively, the second electrical voltage being greater than the first electrical voltage.

4. The method as claimed in claim 3, further comprising applying the voltage to the piezoelectric actuator over time,
wherein a charge level is provided in the development of the voltage applied to the piezoelectric actuator over time, the charge level being located at the level of the first electrical voltage or the nominal charge voltage.

5. The method as claimed in claim 1, wherein the injection of fuel through the injector is carried out several times involving at least one main injection, the charge or polarization voltage being applied during the main injection.

6. The method as claimed in claim 1, wherein the instructing the closure of the injector includes an application of a first electric discharge of the piezoelectric actuator up to the nominal control charge thereof, followed by a second electric discharge of the actuator until the valve means is closed.

7. The method as claimed in claim 6, wherein the first and second electric discharges of the piezoelectric actuator are separated over time.

8. The method as claimed in claim 3, wherein the instructing the closure of the injector includes an application of a first electric discharge of the piezoelectric actuator up to the nominal control charge thereof, followed by a second electric discharge of the actuator until the valve means is closed, and the first electric discharge of the piezoelectric actuator up to the nominal control charge is obtained by application of a first electric discharge current which reduces the voltage at the terminals of the piezoelectric actuator as far as the nominal charge voltage, and
wherein the second electric discharge of the actuator is obtained by an application of a second electric discharge current.

9. The method as claimed in claim 8, further comprising applying the voltage applied to the piezoelectric actuator over time during an electric discharge thereof,
wherein a discharge level is provided in the development of the voltage applied to the piezoelectric actuator over time.

10. The method as claimed in claim 9, wherein the discharge level in the development of the voltage applied to the piezoelectric actuator over time during the electric discharge thereof is located at a voltage which is lower than the nominal charge voltage in order to take into account a phenomenon of hysteresis of the piezoelectric actuator.

11. The method as claimed in claim 1, wherein the polarization charge is deactivated above a predetermined value threshold for torque or rotation speed of the engine.

12. The method as claimed in claim 3, wherein an increase of electrical voltage between the nominal charge voltage and the polarization voltage is between 5 and 40 volts in order to reach a maximum polarization voltage value of 140 volts.

13. The method as claimed in claim 2, wherein the first electric charge and second electric charge are obtained by the respective application of first and second electrical voltages that are a nominal charge voltage and a polarization voltage, respectively, the second electrical voltage being greater than the first electrical voltage.

14. The method as claimed in claim 4, wherein the instructing the closure of the injector includes an application of a first electric discharge of the piezoelectric actuator up to the nominal control charge thereof, followed by a second electric discharge of the actuator until the valve means is closed, and the first electric discharge of the piezoelectric actuator up to the nominal control charge is obtained by application of a first electric discharge current which reduces the voltage at the terminals of the piezoelectric actuator as far as the nominal charge voltage, and
wherein the second electric discharge of the actuator is obtained by an application of a second electric discharge current.

* * * * *